United States Patent
Hong

(10) Patent No.: US 7,082,070 B2
(45) Date of Patent: Jul. 25, 2006

(54) TEMPERATURE DETECTION CIRCUIT AND TEMPERATURE DETECTION METHOD

(75) Inventor: Sang-Pyo Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 10/875,003

(22) Filed: Jun. 22, 2004

(65) Prior Publication Data

US 2005/0018513 A1    Jan. 27, 2005

(30) Foreign Application Priority Data

Jul. 23, 2003    (KR) .................. 10-2003-0050499

(51) Int. Cl.
*G11C 7/04* (2006.01)
*G11C 7/00* (2006.01)

(52) U.S. Cl. ................ 365/211; 365/194; 365/189.07; 365/222

(58) Field of Classification Search ............. 365/211, 365/222, 194, 189.07

See application file for complete search history.

(56) References Cited

U.S. PATENT DOCUMENTS 5,495,452 A * 2/1996 Cha ........................ 365/222
5,680,359 A * 10/1997 Jeong ...................... 708/620

\* cited by examiner

*Primary Examiner*—Son T. Dinh
(74) *Attorney, Agent, or Firm*—Marger Johnson & McCollom, P.C.

(57) ABSTRACT

A temperature detection circuit and method are provided. The temperature detection circuit samples a first delay time for an input signal at a target temperature to be detected, stores a first addresses generated as the sampled result, samples a second delay time for the input address at a present operating temperature, compares a second addresses generated as the sampled result with the first addresses, and generates a detection signal if the target temperature to be detected is the same as the present operating temperature. The temperature detection method is performed by the temperature detection circuit.

14 Claims, 10 Drawing Sheets

TEMPERATURE DETECTION CIRCUIT AND TEMPERATURE DETECTION METHOD

BACKGROUND OF THE INVENTION

This application claims the priority of Korean Patent Application No. 2003-50499, filed on Jul. 23, 2003, in the Korean Intellectual Property Office, the disclosure of which is incorporated herein in its entirety by reference.

1. Field of the Invention

The present invention relates to a temperature detection circuit and method, and more particularly, to a temperature detection circuit and method, which sample the delay time change of a delay circuit according to temperature change, change the sampled result to an address, and detect a temperature using the address.

2. Description of the Related Art

Along with the high-integration, miniaturization, and low power of semiconductor devices, various methods have been developed to reduce an amount of current consumed by the semiconductor device.

A semiconductor device including DRAMs controls its self-refresh period differently according to temperature change in order to reduce current consumption. Accordingly, a temperature detector detects a temperature of such a semiconductor device and controls the self-refresh period of the semiconductor device according to the detected temperature.

Since a conventional temperature detector detects the temperature of the semiconductor device utilizing current change according to temperature change, the detected temperature has large deviation from an actual temperature. That is, the conventional temperature detector cannot detect a small change of temperature.

SUMMARY OF THE INVENTION

The present invention provides a temperature detection circuit and method that are capable of accurately detecting the temperature change of a semiconductor device.

The present invention also provides a semiconductor device that controls its self-refresh period using the temperature detection method and a method therefore.

According to an aspect of the present invention, there is provided a temperature detection circuit comprising: a delay circuit controls a delay time according to temperature change, delays an input signal by a predetermined delay time, and outputs the delayed input signal as an output signal; a sampler samples the predetermined delay time in response to the input signal and converts the sampled result as addresses; an address storage circuit stores a first addresses output from the sampler; and an address comparison circuit compares the first addresses stored in the address storage circuit with a second addresses output from the sampler and outputs the compared result.

The address storage circuit stores the first addresses, the first addresses sampled at a target temperature to be detected, and the address comparison circuit compares the first addresses stored in the address storage circuit with the second addresses output from the sampler, the second addresses sampled at a present operating temperature, and changes a logic level of an output signal of the address comparison circuit if the first addresses are the same as the second addresses.

According to another aspect of the present invention, there is provided a temperature detection circuit comprising: a delay circuit includes a plurality of inverters; a sampler generates sampled addresses according to a difference between an input signal of the delay circuit and an output signal of the delay circuit; an address storage circuit stores a first addresses output from the sampler and sampled at a target temperature to be detected; and an address comparison circuit compares the first addresses stored in the address storage circuit with a second addresses output from the sampler and sampled at a present operating temperature, and outputs the compared result.

At least one inverter among the plurality of inverters is a temperature-dependent delay time.

According to another aspect of the present invention, there is provided a semiconductor device including a temperature detection circuit of claim 6, further comprising: a self-refresh period control circuit for controlling a self-refresh period of the semiconductor circuit, wherein the self-refresh period control circuit controls the self-refresh period in response to an output signal of the address comparison circuit.

According to another aspect of the present invention, there is provided a temperature detection method of a semiconductor device comprising: sampling an input signal at a target temperature to be detected of the semiconductor device and storing a first addresses generated as the sampled result; sampling the input signal at a present operating temperature of the semiconductor device and generating a second addresses as the sampled result; and comparing the first addresses with the second addresses and outputting the compared result.

According to another aspect of the present invention, there is provided a temperature detection method comprising: delaying an input signal by a first delay time at a first temperature and outputting the delayed input signal as an output signal; sampling the first delay time and generating a first addresses; storing the first addresses; delaying the input signal by a second delay time at a second temperature and outputting the delayed input signal as an output signal; sampling the second delay time and outputting a second addresses; and comparing the first addresses with the second addresses and outputting the compared result.

According to another aspect of the present invention, there is provided a temperature detection method used for a semiconductor device comprising: generating and storing a first sampling addresses corresponding to a target temperature to be detected of the semiconductor device; generating a second sampling addresses corresponding to a present operating temperature of the semiconductor device; and receiving and comparing the first sampling addresses and the second sampling addresses and outputting the compared result.

According to another aspect of the present invention, there is provided a method for controlling a self-refresh period of a semiconductor device, the method comprising: generating and storing a first sampling addresses corresponding to a target temperature to be detected of the semiconductor device; generating a second sampling addresses corresponding to a present operating temperature of the semiconductor device; receiving and comparing the first sampling addresses and the second sampling addresses and outputting the compared result; and controlling the self-refresh period of the semiconductor device in response to the compared result.

According to another aspect of the present invention, there is provided a method for controlling a self-refresh period of a semiconductor device, the method comprising: sampling an input signal at a target temperature to be detected of the semiconductor device and storing a first addresses generated as the sampled result; sampling the input signal at a present operating temperature of the semiconductor device and generating a second addresses as the sampled result; comparing the first addresses with the second addresses and outputting the compared result; and controlling the self-refresh period of the semiconductor device in response to the compared result.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings.

The same components of the respective drawings are denoted by the same reference number.

Figure 1:
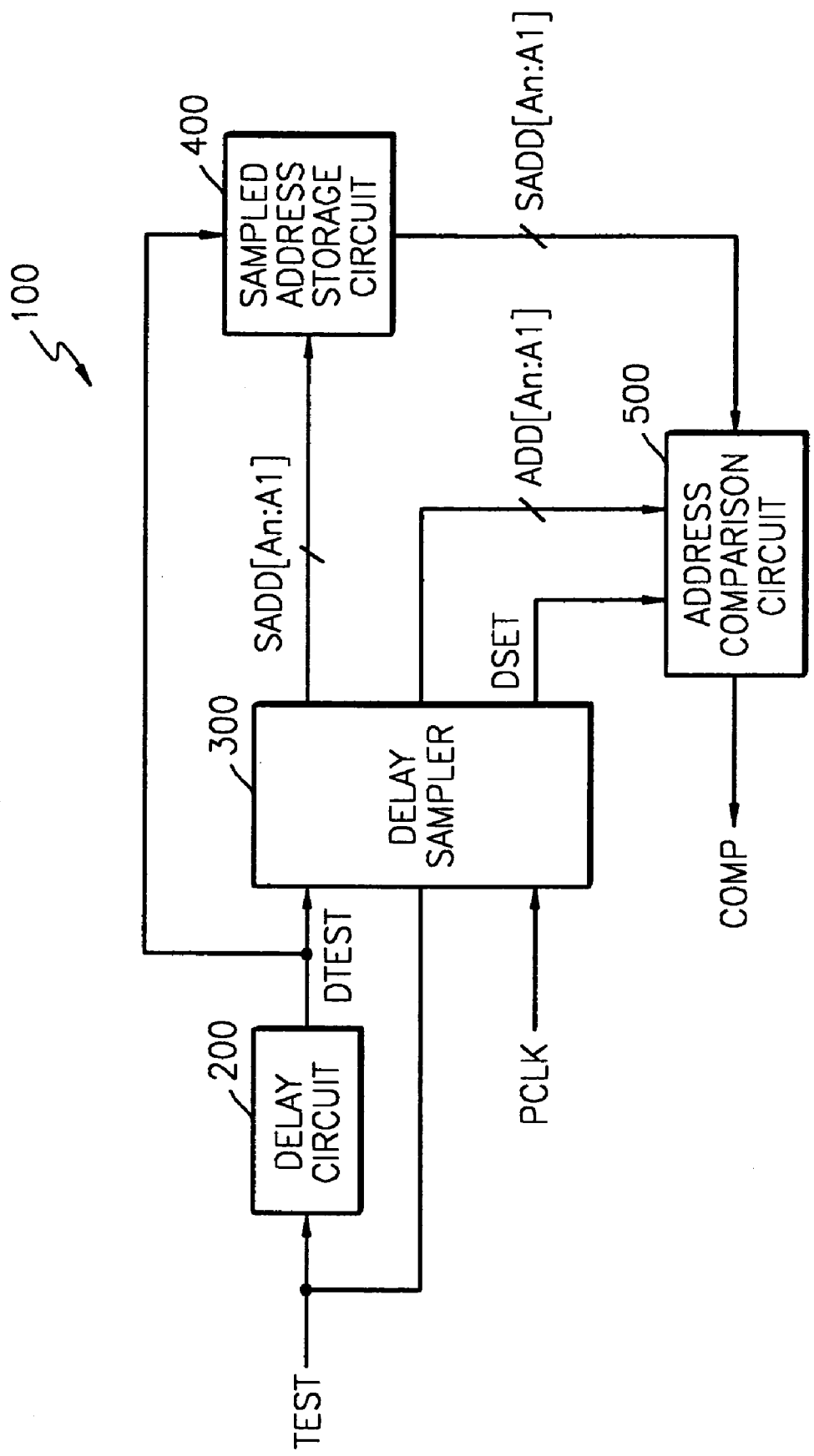
FIG. 1 is a block diagram of a temperature detection circuit according to a preferred embodiment of the present invention.

FIG. 1 is a block diagram of a temperature detection circuit according to a preferred embodiment of the present invention. Referring to FIG. 1, a temperature detection circuit 100 includes a delay circuit 200, a delay sampler 300, a sampled address storage circuit 400, and an address comparison circuit 500.

The delay circuit 200 delays an input signal TEST by a predetermined time and outputs the delayed signal as an output signal DTEST. The delay time is predetermined differently according to a ambient temperature.

The delay sampler 300 starts sampling in response to an input signal TEST and holds addresses SADD[An:A1] or ADD[An:A1] generated as the sampled result in response to the output signal DTEST of the delay circuit 200.

Here, the addresses SADD[An:A1] represents addresses sampled at a specific addresses (target temperature) to be detected and the addresses ADD[An:A1] represents addresses sampled at a present operating temperature.

If a changed amount of delay time according to temperature change is larger than a sampling frequency, the temperature detection circuit 100 can detect even a small change of temperature.

The sampled address storage circuit 400 stores the addresses SADD[An:A1] sampled at the specific target temperature to be detected, in response to the output signal DTEST of the delay circuit 200.

The address comparison circuit 500 compares the sampled addresses SADD[An:A1] sampled at the specific target temperature to be detected with the addresses ADD [An:A1] sampled at the present operating temperature and outputs a compared result COMP. The address comparison circuit 500 performs a comparison operation in response to an enable signal DSET outputted from the delay sampler 300.

Figure 11:
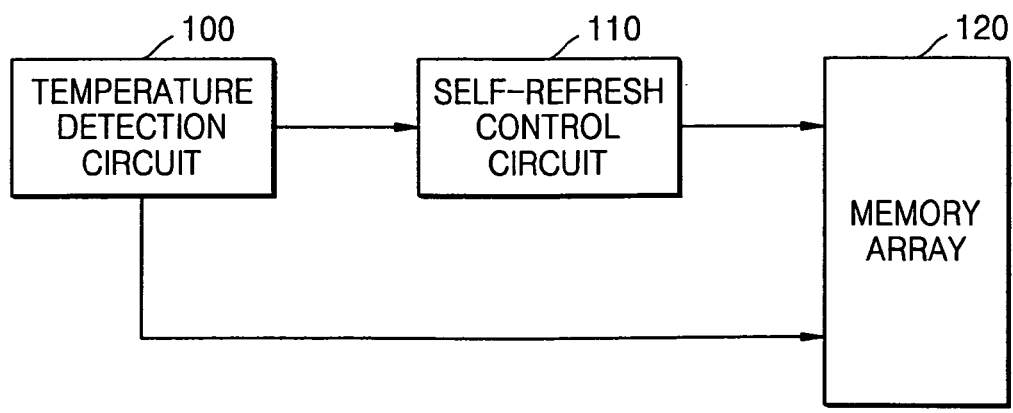
FIG. 11 is a system diagram of a memory system using a temperature detection circuit.

The output signal COMP of the address comparison circuit 500 can be input to a self-refresh period control circuit, discussed at FIG. 11, for controlling a self-refresh period of a semiconductor device including the temperature detection circuit 100. Accordingly, the self-refresh period of the semiconductor device is controlled in response to the output signal COMP of the address comparison circuit 500.

Figure 2A:
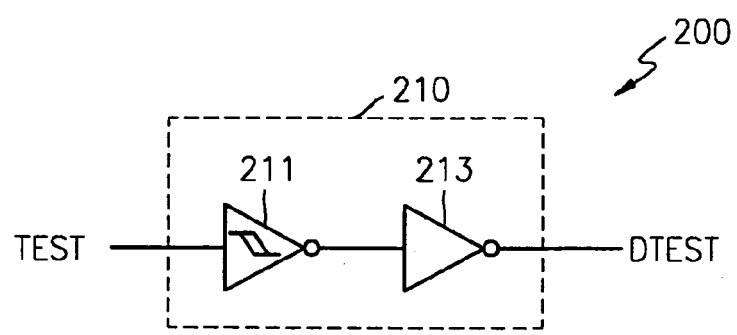
FIG. 2a shows a first embodiment of a delay circuit of FIG. 1.

FIG. 2a shows a first embodiment of the delay circuit of FIG. 1. Referring to FIG. 2a, the delay circuit 200 includes a delay unit 210. The delay unit 210 includes a Schmitt trigger 211 and an inverter 213.

Figure 2B:
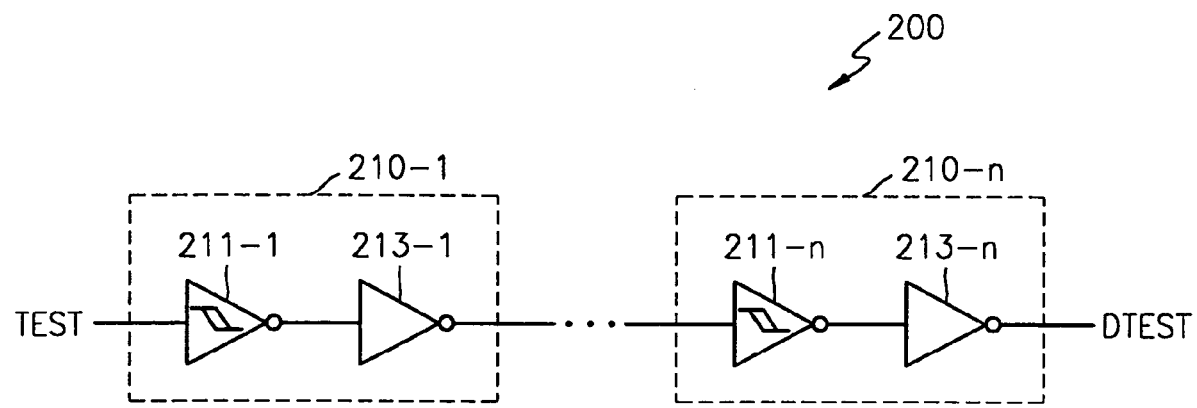
FIG. 2b shows a second embodiment of the delay circuit of FIG. 1

FIG. 2b shows a second embodiment of the delay circuit of FIG. 1. Referring to FIG. 2b, the delay circuit 200 includes n number of delay units 210-1 through 210-n (n is a natural number) connected in serial to each other. The respective delay units 210-1 through 210-n include Schmitt triggers 211-1 through 211-n and inverters 213-1 through 213-n, respectively.

Figure 9:
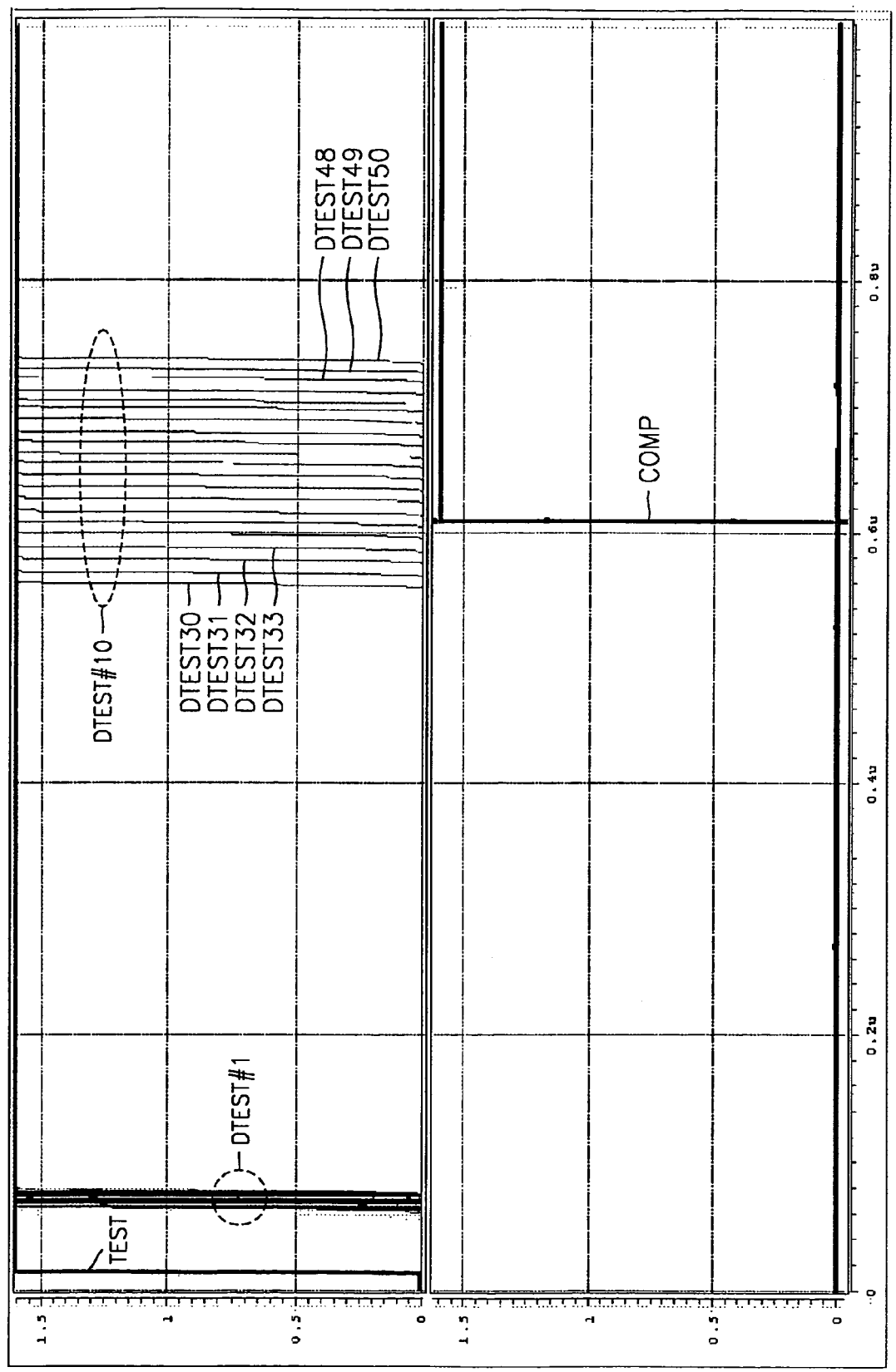
FIG. 9 illustrates input and output waveforms of the delay circuit according to temperature change and the number of delay stages.

In the case where a delay circuit 200 is implemented by n number of delay units (210-1 through 210-n) connected in serial to each other, a delay time for an input signal TEST increases and a delay amount variation according to temperature change becomes larger, as seen in FIG.9.

Figure 3:
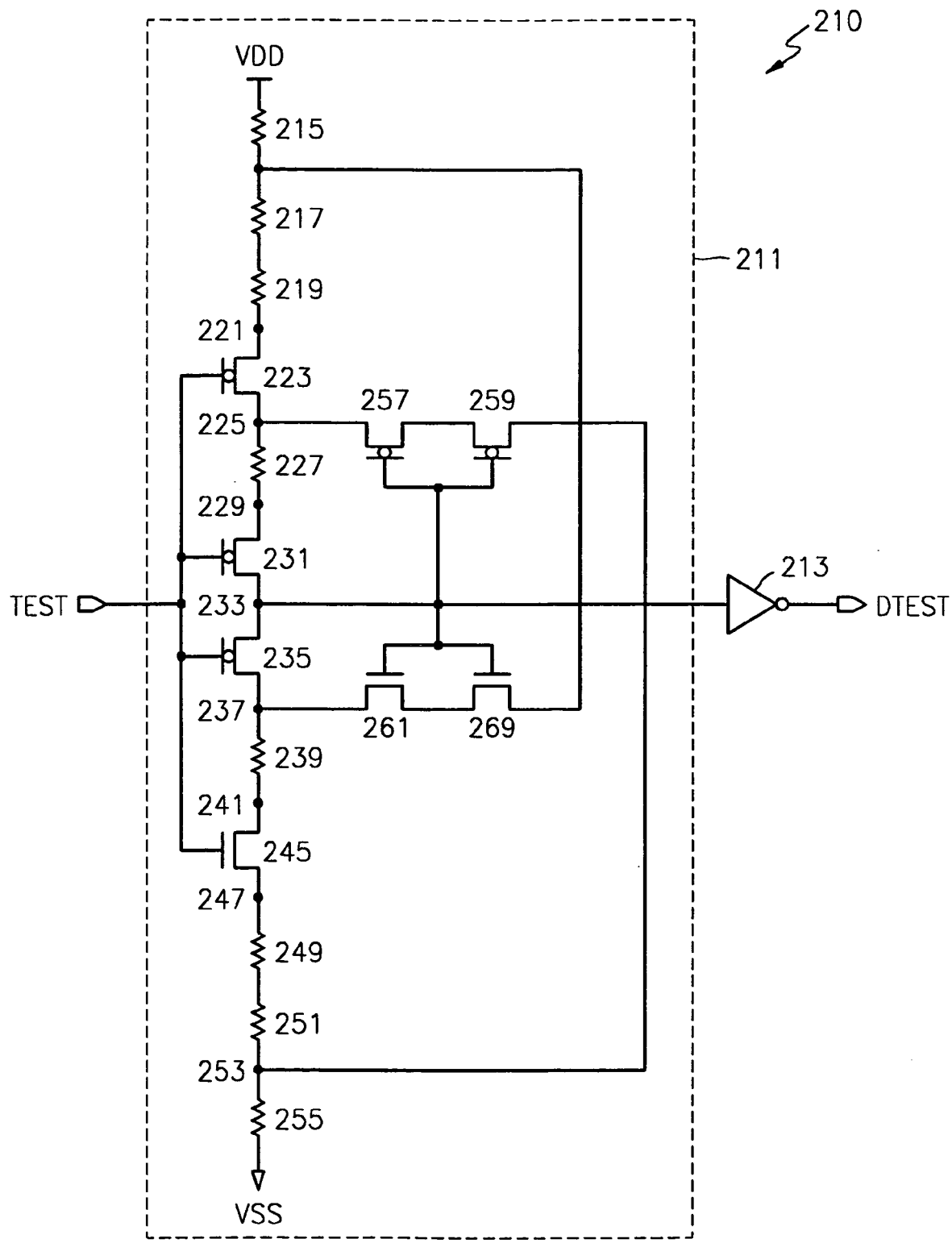
FIG. 3 is a circuit diagram of the delay unit of FIGS. 2a and 2b.

FIG. 3 is a circuit diagram of the delay unit of FIGS. 2a and 2b. Referring to FIG. 3, the delay unit 210 includes a Schmitt trigger 211 and an inverter 213.

The Schmitt trigger 211 has an uni-direction delay and consists of only a plurality of resistors and a plurality of transistors. The construction of the Schmitt trigger 211 is described below.

The input signal TEST is input to the respective gates of respective MOS transistors 223, 231, 235, and 245. A plurality of resistors 215, 217, and 219 are connected in serial between a voltage source VDD and a node 221. A PMOS transistor 223 is connected between the node 221 and a node 225. A resistor 227 is connected between the node 225 and a node 229. The node 225 may be connected to the node 229.

A PMOS transistor 231 is connected between the node 229 and a node 233. A NMOS transistor 235 is connected between the node 233 and a node 237. A resistor 239 is connected between the node 237 and a node 241. A NMOS transistor 245 is connected between the node 241 and a node 247. A plurality of resistors 249, 251, and 255 are connected in serial between the node 247 and a ground voltage source VSS.

The gates of respective PMOS transistors 257 and 259 are connected to the node 233 and the gates of respective NMOS transistors 261 and 269 are connected to the node 233. The PMOS transistors 257 and 259 connected in serial to each other are connected between the node 225 and a node 253.

The NMOS transistors 261 and 269 connected in serial to each other are connected between the node 237 and a common node of the resistors 215 and 217.

Figure 4:
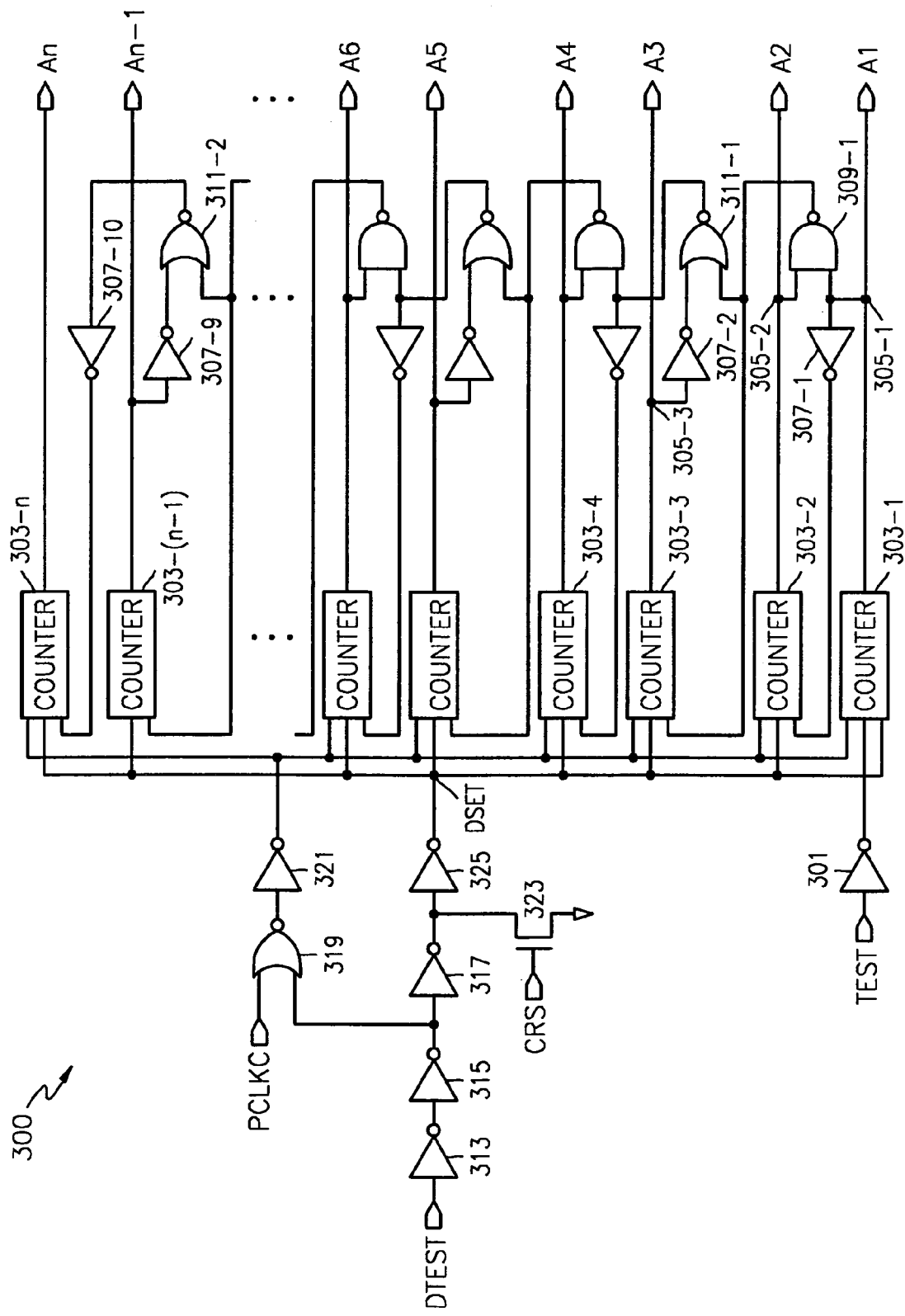
FIG. 4 shows a delay sampler of FIG. 1.

FIG. 4 shows the delay sampler of FIG. 1. The delay sampler 300 is provided to sample a delay time (or delay amount) of the input signal TEST. The delay sampler 300 samples a delay time generated by the delay circuit 200 into an address (or address value).

The input signal TEST is input to a counter 303-1 through an inverter 301. The delay sampler 300 starts sampling in response to the input signal TEST and latches addresses sampled in response to the output signal DTEST of the delay circuit 200.

The output signal DTEST of the delay circuit 200 is input to respective counters 303-1 through 303-n via a plurality of inverters 313, 315, 317, and 325 connected in serial to each other, respectively.

A NOR gate 319 NORs a clock signal PCLK and an output signal of the inverter 315. An inverter 321 inverts an output signal of the NOR gate 319 and outputs the inversed signal to the respective counters 303-1 through 303-n.

A NMOS transistor 323 is connected between an output terminal of the inverter 317 and the ground voltage source VSS, and a reset signal CRS is input to the gate of the NMOS transistor 323. Accordingly, when the reset signal CRS is activated (logic High), the respective counters 303-1 through 303-n are reset.

An output signal A1 of the counter 303-1 is a LSB (Least significant bit) of the sampled addresses SADD[An:A1] or addresses ADD[An:A1]. An inverter 307-1 inverts the output signal A1 of the counter 303-1 and outputs the inverted signal to the counter 303-2.

An output signal A2 of the counter 303-2 is a second bit of the sampled addresses SADD[An:A1] or addresses ADD [An:A1]. A NAND gate 309-1 NANDs the output signal A1 of the counter 303-1 and the output signal A2 of the counter 303-2 and outputs the result to the counter 303-3.

An output signal A3 of the counter 303-3 is a third bit of the sampled addresses SADD[An:A1] or addresses ADD [An:A1]. A NOR gate 311-1 NORs an output signal of an inverter 307-2 and an output signal of the NAND gate 309-1. An output signal of an NOR gate 311-1 is input to the counter 303-4 via an inverter.

An output signal An of the counter 303-n is a MSB (most significant bit) of the sampled addresses SADD[An:A1] or addresses ADD[An:A1]. The counter 303-n generates a MSB of addresses (SADD[An:A1] or ADD[An:A1]) sampled in response to the output signals of the respective inverters 321 and 325 and an output signal of an inverter 307-10.

Figure 8:
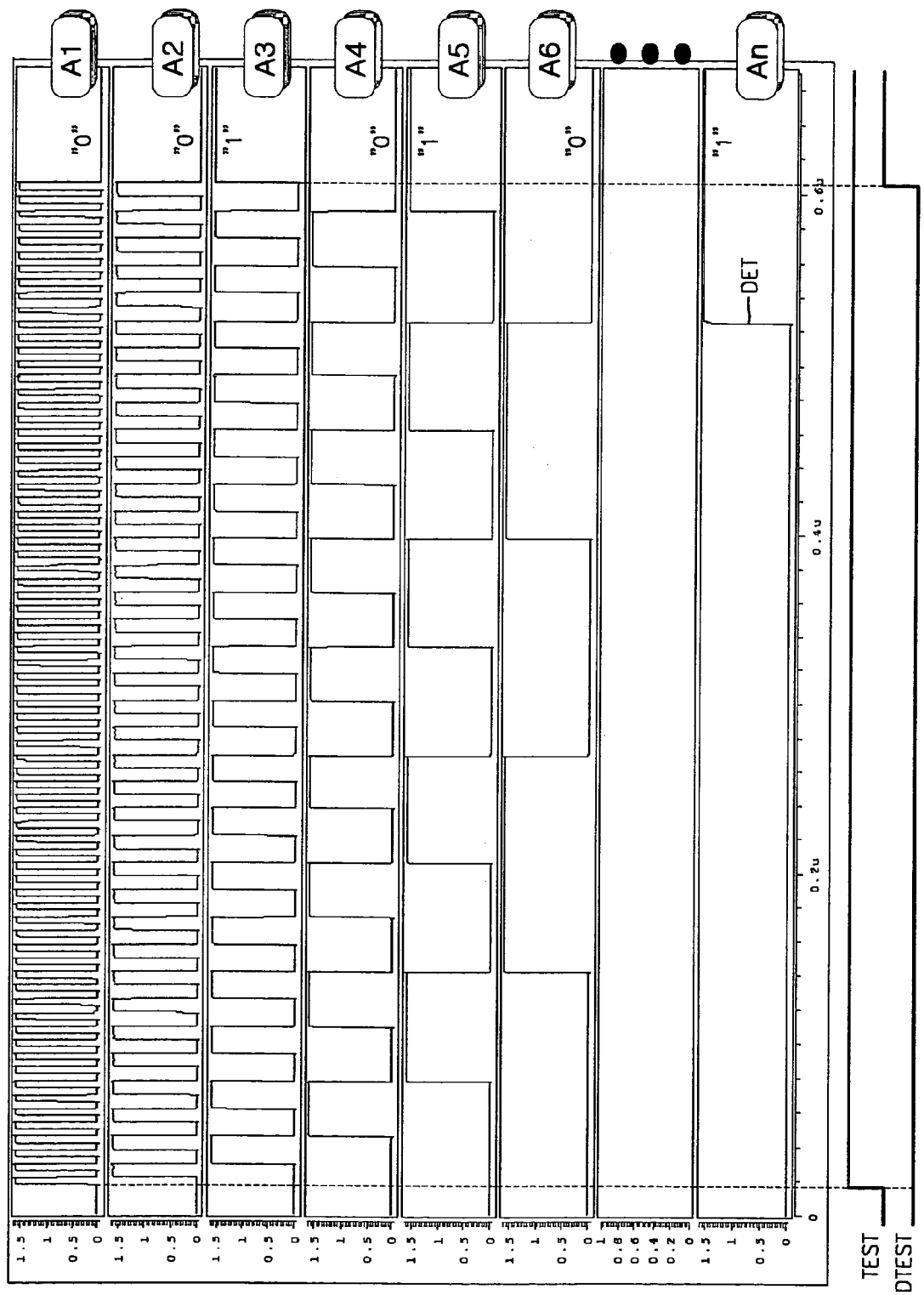
FIG. 8 illustrates output waveforms of the delay sampler of FIG. 1.

FIG. 8 illustrates the output waveforms of the delay sampler of FIG. 1. Referring to FIG. 8, the respective counters 303-1 through 303-n act as frequency dividers. The delay sampler 300 generates addresses [An:A1] in response to a rising edge of the input signal TEST and latches the addresses [An:A1] generated in response to a rising edge of the output signal DTEST of the delay circuit 200.

Figure 5:
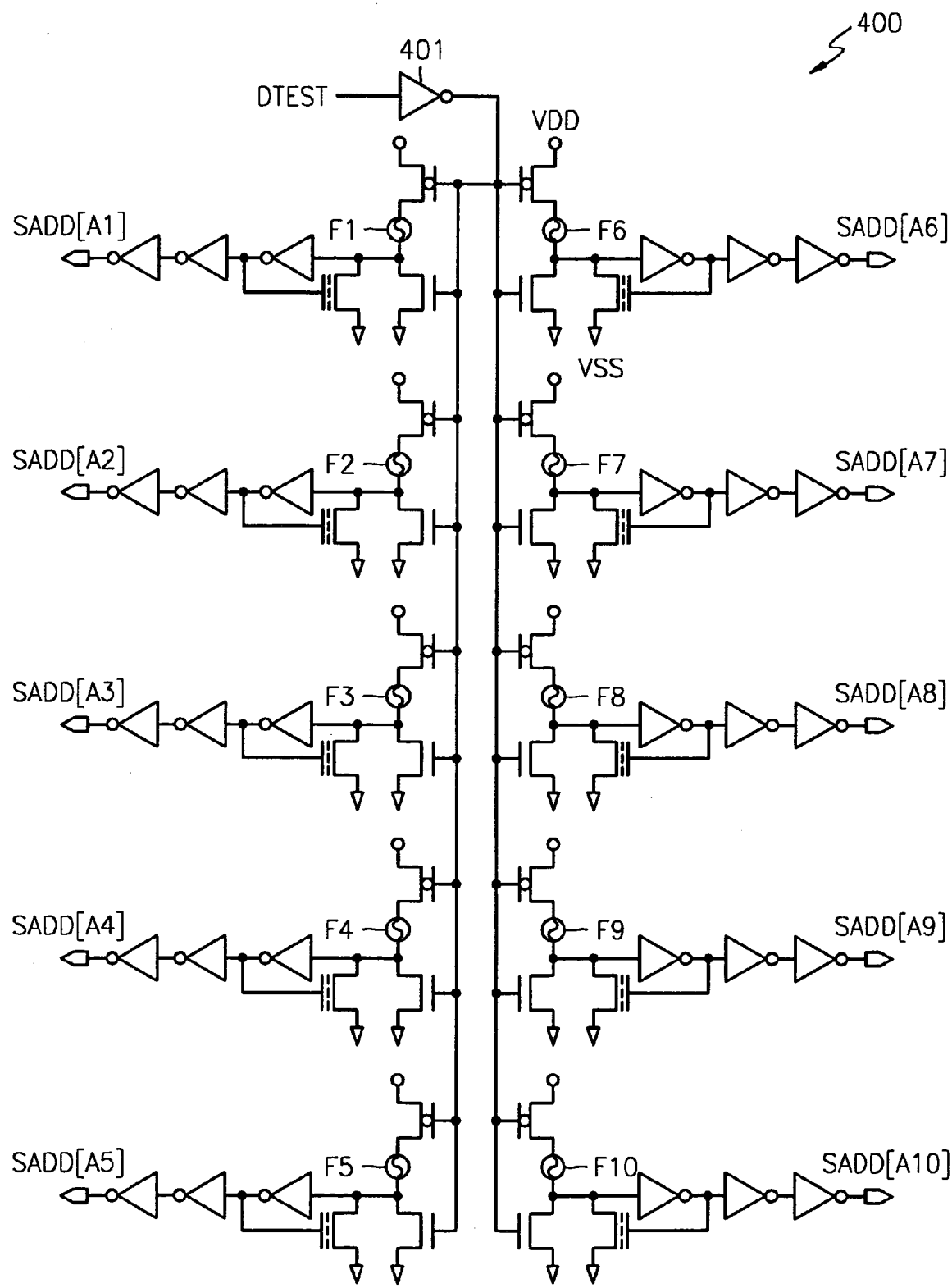
FIG. 5 shows a sampled address storage circuit of FIG. 1.

FIG. 5 shows the sampled address storage circuit of FIG. 1. The sampled address storage circuit 400 receives and stores addresses SADD[An:A1] sampled at a specific target temperature to be detected, in response to the output signal DTEST of the delay circuit 200.

FIG. 5 shows sampled address storage circuit 400 using fuses, as an embodiment of the address storage circuit 400. FIG. 5 is an embodiment of an address circuit for storing addresses SADD[An:A1] of 10 bits.

The addresses SADD[An:A1] outputted from the delay sampler 300 is checked through predetermined pads (not shown) and the addresses SADD[An:A1] outputted from the delay sampler 300 is stored (or programmed) by cutting a corresponding fuse (F1 through F10).

The output signal DTEST of the delay circuit 200 is input to the input terminal of an inverter 401 and the output terminal of the inverter 401 is connected to the gates of the respective transistors. Accordingly, since the respective PMOS transistors connected to the output terminal of the inverter 401 are turned on, the addresses SADD[An:A1] can be programmed by cutting the corresponding fuse (F1 through F10).

The sampled address storage circuit 400 which stores the addresses SADD[An:An] output from the delay sampler 300 may be implemented by a Mode Register Set (MRS) or a logic circuit.

Figure 6:
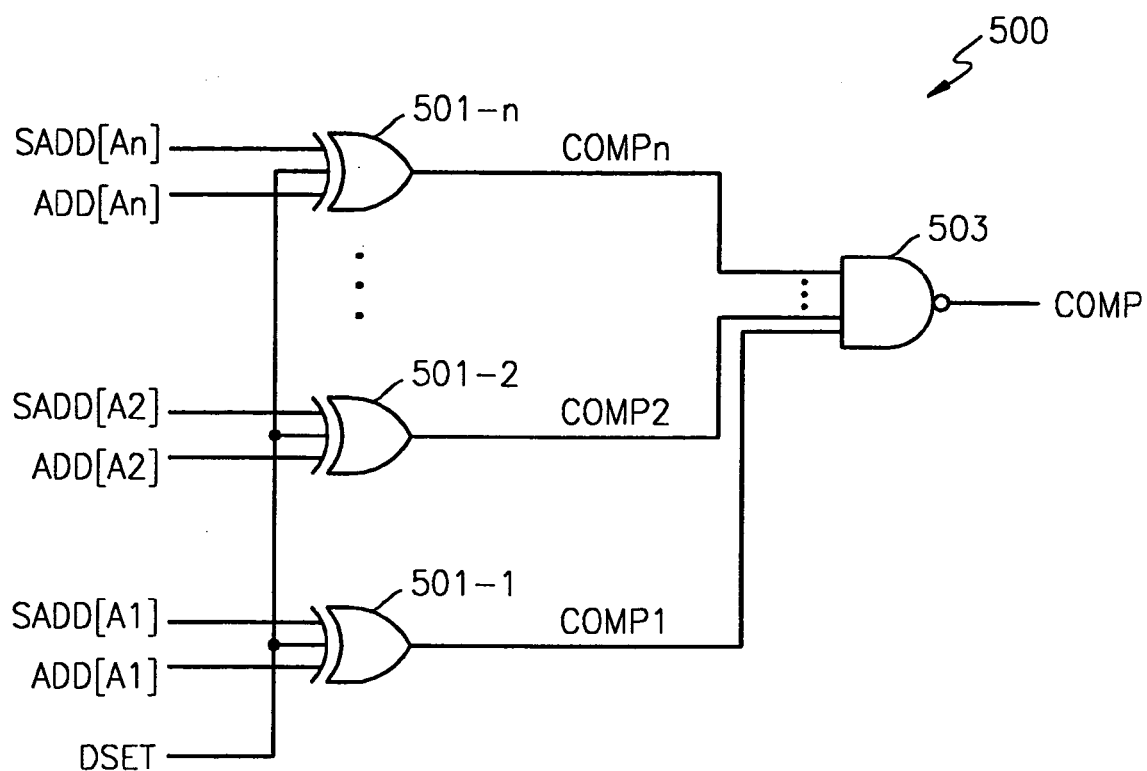
FIG. 6 is a circuit diagram of an address comparison circuit of FIG. 1.

FIG. 6 is the circuit diagram of the address comparison circuit of FIG. 1. Referring to FIG. 6, the address comparison circuit 500 includes n number of Exclusive-OR circuits (or comparators) 501-1 through 501-n and a NAND gate 503.

The respective Exclusive-OR circuits 501-1 through 501-n are activated in response to the enable signal DSET, compares the addresses SADD[An:A1] output from the sampled address storage circuit 400 with the addresses ADD[An:A1] output from the delay sampler 300 in a bitwise, and outputs the compared results COMP1 through COMPn. Here, the enable signal DSET is a signal associated with the output signal DTEST of the delay circuit 200.

The NAND gate 503 NANDs the respective output signals COMP1 through COMPn of the respective Exclusive-OR circuits 501-1 through 501-n.

The output signal COMP of the address comparison circuit 500 can be used as an input signal to be input to a control circuit (not shown) for controlling a period. For example, the output signal COMP of the address comparison circuit 500 can be input to a self-refresh period control circuit of a semiconductor device.

If the addresses SADD[An:A1] sampled at the specific target temperature to be detected is the same as the addresses ADD[An:A1] sampled at the present operating temperature, the output signal COMP of the address comparison circuit 500 transitions from a logic "low" to a logic "high".

Figure 7:
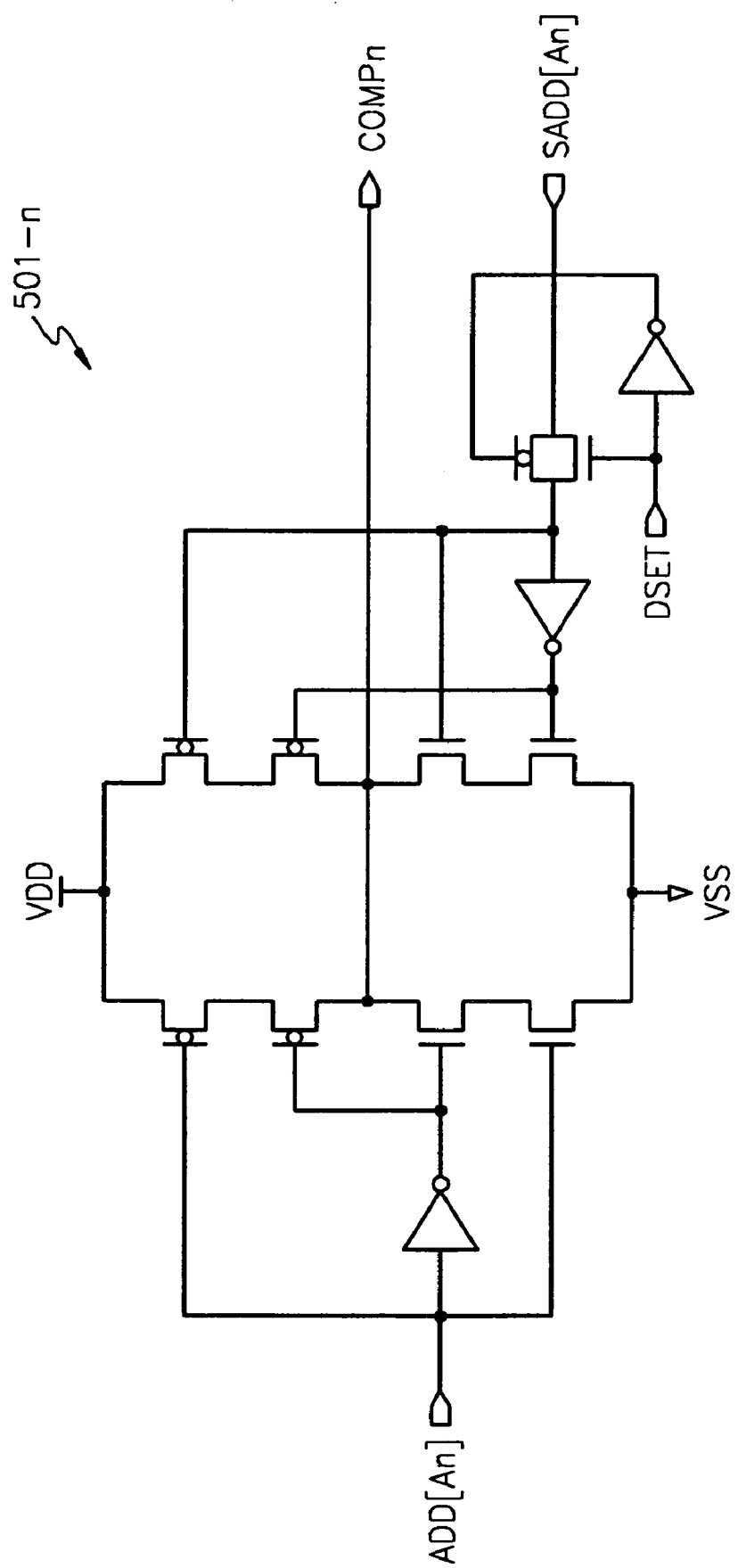
FIG. 7 is a circuit diagram of a comparator of FIG. 6.

FIG. 7 is a circuit diagram of the comparator of FIG. 6. Referring to FIGS. 6 and 7, when an enable signal DSET is activated (for example, a logic 'high'), the respective comparators 510-1 through 510-n compare the addresses SADD [An:A1] sampled at the target temperature to be detected with the addresses ADD[An:A1] sampled at the present operating temperature and outputs the compared results COMP1 through COMPn.

FIG. 9 illustrates the input and output waveforms of the delay circuit according to temperature change and the number of delay stages. Referring to FIG. 9, TEST is an input signal of the delay circuit 200 as shown in FIG. 2a, and DTEST#1 is an output signal DTEST of the delay circuit 200 at each temperature in a case where the delay circuit 200 is implemented by one delay unit and an ambient temperature of the delay circuit is changed from 30° C. through 50° C.

In the case of using one delay unit, a changed amount of the output signal of the delay circuit 200 according to temperature change is small.

DTEST#10 is an output signal DTEST of the delay circuit 200 as shown in FIG. 2b at each temperature in the case where the delay circuit 200 is implemented by 10 delay units connected in serial to each other and the ambient temperature of the delay circuit 200 is changed from 30° C. through 50° C.

DTEST30 represents a case where the ambient temperature of the delay circuit 200 is 30° C., DTEST31 represents a case where the ambient temperature of the delay circuit 200 is 31° C., and DTEST50 represents a case where the ambient temperature of the delay circuit 200 is 50° C.

Referring to FIG. 9, as the number of delay units is more, the delay time increases, and as the ambient temperature of the delay circuit 200 is higher, the delay time increases.

Figure 10:
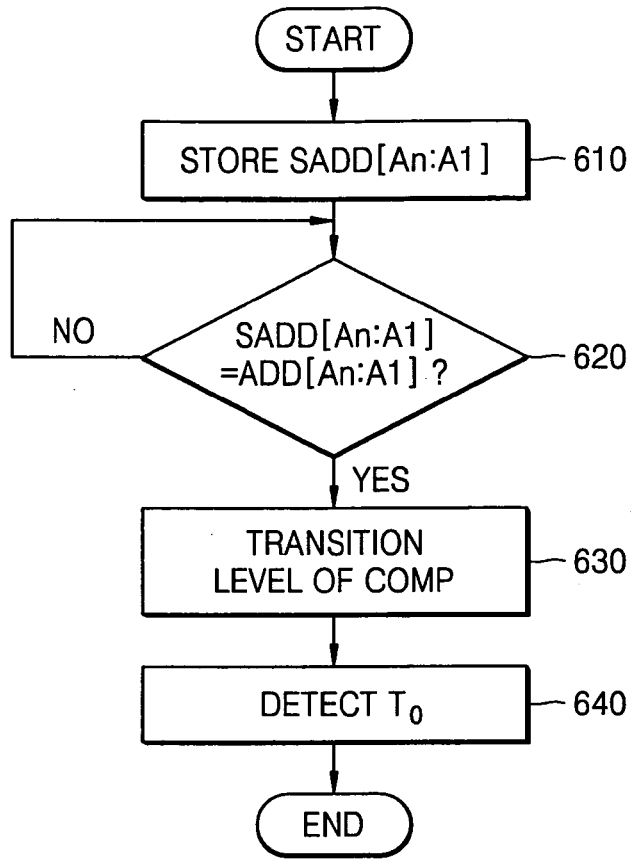
FIG. 10 is a flowchart illustrating a temperature detection method according to a preferred embodiment of the present invention.

FIG. 10 is a flowchart illustrating a temperature detection method according to a preferred embodiment of the present invention. Referring to FIGS. 1 through 10, a temperature detection apparatus and method according to the present invention are described in detail below.

First, it is assumed that a target temperature TO to be detected is 35° C. and the number of delay units used for the delay circuit 200 is 10.

While the ambient temperature of the delay circuit 200 maintains 35° C., an input signal TEST is input to the delay circuit 200. At this time, the delay sampler 300 begins to generate addresses SADD[An:A1] in response to the input signal TEST.

The delay circuit 200 delays the input signal TEST by a predetermined time corresponding to the temperature of 35° C. and outputs the delayed input signal as an output signal DTEST. In a case where the output signal DTEST of the delay circuit 200 transitions from a logic 'low' to a logic 'high', the delay sampler 300 stops increasing the addresses SADD[An:A1]. Accordingly, the delay sampler 300 latches currently generated addresses SADD[An:A1].

Also, in the case where the output signal DTEST of the delay circuit 200 transitions from the logic 'low' to the logic 'high', the sampled address storage circuit 400 receives and stores the latched addresses SADD[An:A1] (step 610).

If the temperature detection circuit is operated, the delay circuit 200 receives the input signal TEST, delays the input signal TEST by a predetermined time corresponding to a present operating temperature, and outputs the delayed input signal as an output signal DTEST. In a case where the output signal DTEST of the delay circuit 200 transitions from a logic 'low' to a logic 'high', the delay sampler 300 stops generating addresses ADD[An:A1]. Accordingly, the delay sampler 300 latches currently generated addresses ADD[An:A1].

The address comparison circuit 500 compares the addresses SADD[An:A1] sampled at 35° C. with the addresses ADD[An:A1] sampled at the present operating temperature in a bitwise (step 620).

If the target temperature (35° C.) to be detected is the same as the present operating temperature, the output signal COMP of the address comparison circuit 500 transitions from the logic 'low' to the logic 'high', as shown in FIG. 9 (step 630).

Accordingly, the target temperature (35° C.=T0) to be detected can be detected through the logic level transition of the output signal COMP output from the address comparison circuit 500.

However, if the target temperature (35° C.) to be detected is different from the present operating temperature, the address comparison circuit compares the addresses SADD[An:A1] sampled at the target temperature to be detected with the addresses ADD[An:A1] sampled at the present operating temperature in a bitwise (step 620).

As described above, the temperature detection circuit and method according to the present invention can detect even a small change of temperature.

In one system level embodiment, the output of the temperature detection circuit can be used by a self-refresh control circuit of a memory array to determine the self-refresh cycle. The temperature detection circuit 100 detects the operating temperature of the memory array 120. Depending upon the operating temperature of the memory array 120, the self-refresh control circuit 110 may alter the refresh period of the memory array to avoid loss of data. The temperature detection circuit 100 detects even very small changes in temperature.

Therefore, a semiconductor device according to the present invention, which includes the temperature detection circuit and uses the temperature detection method, can correctly control its self-refresh period according to temperature change. Accordingly, it is possible to reduce an amount of current consumed by the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A temperature detection circuit comprising:
   a delay circuit controls a delay time according to temperature change, delays an input signal by a predetermined delay time, and outputs the delayed input signal as an output signal;
   a sampler samples the predetermined delay time in response to the input signal and converts the sampled result as addresses;
   an address storage circuit stores a first addresses output from the sampler; and
   an address comparison circuit compares the first addresses stored in the address storage circuit with a second addresses output from the sampler and outputs the compared result.

2. The temperature detection circuit of claim 1, wherein the delay circuit includes a plurality of inverters connected in serial to each other.

3. The temperature detection circuit of claim 2, wherein at least one inverter among the plurality of inverters is a Schmitt trigger.

4. The temperature detection circuit of claim 1, wherein the address storage circuit stores the first addresses output from the sampler, the first addresses sampled at a target temperature to be detected.

5. The temperature detection circuit of claim 1, wherein the address storage circuit stores the first addresses, the first addresses sampled at a target temperature to be detected, and
   the address comparison circuit compares the first addresses stored in the address storage circuit with the second addresses output from the sampler, the second addresses sampled at a present operating temperature, and changes a logic level of an output signal of the address comparison circuit if the first addresses are the same as the second addresses.

6. A temperature detection circuit comprising:
   a delay circuit includes a plurality of inverters;
   a sampler generates sampled addresses according to a difference between an input signal of the delay circuit and an output signal of the delay circuit;

an address storage circuit stores a first addresses output from the sampler and sampled at a target temperature to be detected; and an address comparison circuit compares the first addresses stored in the address storage circuit with a second addresses output from the sampler and sampled at a present operating temperature, and outputs the compared result.

7. The temperature detection circuit of claim 6, wherein at least one inverter among the plurality of inverters has a temperature-dependent delay time.

8. The temperature detection circuit of claim 6, wherein at least one inverter among the plurality of inverters is a Schmitt trigger having a temperature-dependent delay time.

9. A semiconductor device including a temperature detection circuit of claim 6, further comprising:

a self-refresh period control circuit for controlling a self-refresh period of the semiconductor circuit, wherein the self-refresh period control circuit controls the self-refresh period in response to an output signal of the address comparison circuit.

10. A temperature detection method of a semiconductor device comprising:

sampling an input signal at a target temperature to be detected of the semiconductor device and storing a first addresses generated as the sampled result;

sampling the input signal at a present operating temperature of the semiconductor device and generating a second addresses as the sampled result; and comparing the first addresses with the second addresses and outputting the compared result.

11. A temperature detection method comprising:

delaying an input signal by a first delay time at a first temperature and outputting the delayed input signal as an output signal;

sampling the first delay time and generating a first addresses;

storing the first addresses;

delaying the input signal by a second delay time at a second temperature and outputting the delayed input signal as an output signal;

sampling the second delay time and outputting a second addresses; and comparing the first addresses with the second addresses and outputting the compared result.

12. A temperature detection method used for a semiconductor device comprising:

generating and storing a first sampling addresses corresponding to a target temperature to be detected of the semiconductor device;

generating a second sampling addresses corresponding to a present operating temperature of the semiconductor device; and receiving and comparing the first sampling addresses and the second sampling addresses and outputting the compared result.

13. A method for controlling a self-refresh period of a semiconductor device, the method comprising:

generating and storing a first sampling addresses corresponding to a target temperature to be detected of the semiconductor device;

generating a second sampling addresses corresponding to a present operating temperature of the semiconductor device;

receiving and comparing the first sampling addresses and the second sampling addresses and outputting the compared result; and controlling the self-refresh period of the semiconductor device in response to the compared result.

14. A method for controlling a self-refresh period of a semiconductor device, the method comprising:

sampling an input signal at a target temperature to be detected of the semiconductor device and storing a first addresses generated as the sampled result;

sampling the input signal at a present operating temperature of the semiconductor device and generating a second addresses as the sampled result;

comparing the first addresses with the second addresses and outputting the compared result; and controlling the self-refresh period of the semiconductor device in response to the compared result.

* * * * *